(12) United States Patent
Islam et al.

(10) Patent No.: US 11,043,612 B2
(45) Date of Patent: Jun. 22, 2021

(54) LIGHT EMITTING DIODES USING ULTRA-THIN QUANTUM HETEROSTRUCTURES

(71) Applicants: Cornell University, Ithaca, NY (US); University of Notre Dame du Lac, Notre Dame, IN (US)

(72) Inventors: SM Islam, Ithaca, NY (US); Vladimir Protasenko, Ithaca, NY (US); Huili Grace Xing, Ithaca, NY (US); Debdeep Jena, Ithaca, NY (US); Jai Verma, Portland, OR (US)

(73) Assignee: Cornell University, Ithaca, NY (US)

( * ) Notice: Subject to any disclaimer, the term of this patent is extended or adjusted under 35 U.S.C. 154(b) by 149 days.

(21) Appl. No.: 16/192,325

(22) Filed: Nov. 15, 2018

(65) Prior Publication Data

US 2019/0148584 A1   May 16, 2019

Related U.S. Application Data

(60) Provisional application No. 62/586,466, filed on Nov. 15, 2017, provisional application No. 62/586,488, filed on Nov. 15, 2017.

(51) Int. Cl.
*H01L 33/32* (2010.01)
*H01L 33/14* (2010.01)
(Continued)

(52) U.S. Cl.
CPC ............ *H01L 33/32* (2013.01); *H01L 27/15* (2013.01); *H01L 33/007* (2013.01);
(Continued)

(58) Field of Classification Search
CPC ....... H01L 33/32; H01L 33/325; H01L 33/30; H01L 33/0062; H01L 33/02;
(Continued)

(56) References Cited

U.S. PATENT DOCUMENTS

2016/0149075 A1*  5/2016  Atanackovic ........... H01L 33/08
                                                        257/13
2016/0380150 A1* 12/2016  Gaska .................... H01L 33/32
                                                        257/13

(Continued)

OTHER PUBLICATIONS

Dylan Bayeri et al., Deep ultraviolet emission from ultra-thin GaN/AlN heterostructures, Applied Physics Letters, 109, 241102. (Year: 2016).*

(Continued)

*Primary Examiner* — Stephen W Smoot
*Assistant Examiner* — Vicki B. Booker
(74) *Attorney, Agent, or Firm* — Culhane Meadows PLLC; Orlando Lopez

(57) ABSTRACT

A DUV-LED including a bottom substrate, a n-contact/injection layer formed on the bottom substrate, a p-contact region, and an emitting active region between the n-contact/injection layer and the contact region. The emitting active region includes at least one GaN quantum heterostructure. The at least one GaN quantum heterostructures is sized and shaped to determine a certain emission wavelength. Preferably, the certain emission wavelength is in a range of approximately 219-280 nm. In one embodiment, the size is controlled by precisely controlling parameters selected from the group consisting of: an epitaxial deposition time; a Ga/N ratio; a thermal annealing time; a temperature during deposition; and combinations thereof.

14 Claims, 9 Drawing Sheets

(51) Int. Cl.
*H01L 33/00* (2010.01)
*H01L 33/02* (2010.01)
*H01L 27/15* (2006.01)
*H01L 33/06* (2010.01)
*H01L 33/12* (2010.01)
*H01L 33/30* (2010.01)
*H01L 33/38* (2010.01)

(52) U.S. Cl.
CPC ...... *H01L 33/0025* (2013.01); *H01L 33/0062* (2013.01); *H01L 33/0075* (2013.01); *H01L 33/02* (2013.01); *H01L 33/025* (2013.01); *H01L 33/06* (2013.01); *H01L 33/12* (2013.01); *H01L 33/14* (2013.01); *H01L 33/30* (2013.01); *H01L 33/325* (2013.01); *H01L 33/38* (2013.01)

(58) Field of Classification Search
CPC ... H01L 33/0025; H01L 33/007; H01L 33/14; H01L 33/0075; H01L 33/025; H01L 27/15; H01L 33/06; H01L 33/12; H01L 33/38
See application file for complete search history.

(56) References Cited

U.S. PATENT DOCUMENTS

2017/0256672 A1  9/2017  Jain et al.
2018/0277715 A1  9/2018  Ma et al.

OTHER PUBLICATIONS

Applied Physics Letter 102, 041103 (2013)—Tunnel-injection GaN quantum dot ultraviolet light-emitting diodes.
SM Islam et al., Sub-230 nm deep-UV emission from GaN quantum disks in AlN grown by a modified Stranski-Krastanov mode, Japanese Journal of Applied Physics 55, 05FF06 (2016).
Jai Verma et al., Tunnel-injection quantum dot deep-ultraviolet light-emitting diodes with polarization-induced doping in III-nitride heterostructures, Applied Physics Letters 104, 021105 (2014).
S. M. Islam et al., MBE-grown 232-270 nm deep-UV LEDs using monolayer thin binary GaN/AlN quantum heterostructures, Applied Physics Letters 110, 041108 (2017).
S. M. Islam et. al., Deep-UV emission at 219 nm from ultrathin MBE GaN/AlN quantum heterostructures, Appl. Phys. Lett. 111, 091104 (2017).
Shyam Bharadwaj et al., High-Temperature p-Type Polarization Doped AlGaN Cladding for sub-250 nm deep-UV Quantum Well LEDs by MBE (2017).

* cited by examiner

LIGHT EMITTING DIODES USING ULTRA-THIN QUANTUM HETEROSTRUCTURES

CROSS-REFERENCE TO RELATED APPLICATIONS

This application claims priority to U.S. Provisional Patent Application No. 62/586,466, filed Nov. 15, 2017, and U.S. Provisional Patent Application No. 62/586,488, filed Nov. 15, 2017, each of which is incorporated herein by reference.

BACKGROUND OF THE INVENTION

1. Field of the Invention

The subject disclosure relates to light-emitting diodes (LEDs), and more particularly to improved LEDs having ultra-thin quantum heterostructures configured to control the photon emission wavelength.

2. Background of the Related Art

Replacing mercury-based DUV lamps with semiconductor LEDs is environmentally friendly, enables miniaturization, and enhances portability. DUV emission from LEDs using AlGaN multi-quantum well light-emitting active regions has been demonstrated but typically suffers from low external quantum efficiency (EQE), which drops particularly for wavelengths shorter than 240 nm. Several factors contribute to the low EQE such as: non-native substrates create large lattice mismatch, leading to dislocation densities; poor doping efficiency; limited light extraction efficiency because of total internal reflection due to refractive index mismatch; and polarization properties of the emitted light that makes light extraction efficiency difficult.

Low internal quantum efficiency (IQE) is also a barrier to product development. IQE decreases due to high densities of threading dislocations and due to the quantum-confined stark effect (QCSE).

Further, deep ultra-violet light emitting diodes (DUV-LEDs), say less than 280 nm emission wavelength, are currently realized using ternary $Al_xGa_{1-x}N/Al_yGa_{1-y}N$ quantum well/barrier heterostructures where the light is generated in the AlGaN material. The polarization property of the emitted light is strongly dependent on the Al content of AlGaN active region (value of x).

SUMMARY OF THE INVENTION

In view of the above, a need exists for technology to fabricate DUV-LEDs with improved EQE and/or IQE. Further, it is desirable for a DUV-LED to have a tunable wavelength for optimal use in various applications.

One embodiment of the subject technology is a method for producing the DUV light for an LED comprising the step of using ultra-thin GaN/AlN quantum heterostructures, which results high internal quantum efficiency for enhanced wavefunction overlap and TE polarized light emission from GaN to enhances light extraction.

Another method producing DUV light for an LED comprising the step of tuning a wavelength over a 219-280 nm DUV range by only changing a geometry of a GaN layer. A size of the GaN layer can be controlled during fabrication by controlling an epitaxial deposition time. A shape of the GaN layer can be determined by changing a Ga/N ratio. The shape of the GaN layer can also determined by thermal anneal of the deposited GaN layer in high vacuum during the epitaxy. The subject technology also includes a light emitting diode (LED) comprising an emitting region with at least one ultra-thin GaN heterostructure. A number of layers of heterostructures is from 2 to 10, wherein the ultra-thin quantum heterostructure has a thickness ranging approximately from 0.25 nm to 0.75 and is a quantum dot/disk.

Another embodiment of the subject technology is directed to a DUV-LED having a bottom substrate, a n-contact/injection layer formed on the bottom substrate, a p-contact region, and an emitting active region between the n-contact/injection layer and the p-contact region, the emitting active region including at least one GaN quantum heterostructure. The at least one GaN quantum heterostructure may be selected from the group consisting of: a quantum well; a quantum dot/disk; and combinations thereof. The n-contact/injection layer can include: a first region for accommodating strain relaxation; a second region for lateral access with a low sheet resistance and higher conductivity compared to the first region to minimize resistive losses and heat generation; and a third region of a graded vertical injection layer with low vertical resistance to minimize heat loss due to vertical resistance. The at least one GaN quantum heterostructure is preferably three ultra-thin monolayers of quantum wells and quantum dots/discs within AlN barriers of approximately 2-3 nm. The at least one GaN quantum heterostructures is sized and shaped to determine a certain emission wavelength. The certain emission wavelength can be in a range of approximately 219-280 nm. The size may be controlled by precisely controlling parameters selected from the group consisting of: an epitaxial deposition time; a Ga/N ratio; a thermal annealing time; a temperature during deposition; and combinations thereof. The at least one GaN quantum heterostructure may be three ultra-thin monolayers of quantum wells and quantum dots/discs within AlN barriers of approximately 2-3 nm. In one embodiment, operation of the emitting active region is pulsed such as by being connected in series with a MOSFET.

It should be appreciated that the subject technology can be implemented and utilized in numerous ways, including without limitation as a process, an apparatus, a system, a device, a method for applications now known and later developed. These and other unique features of the system disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION OF PREFERRED EMBODIMENTS

Figure 1:
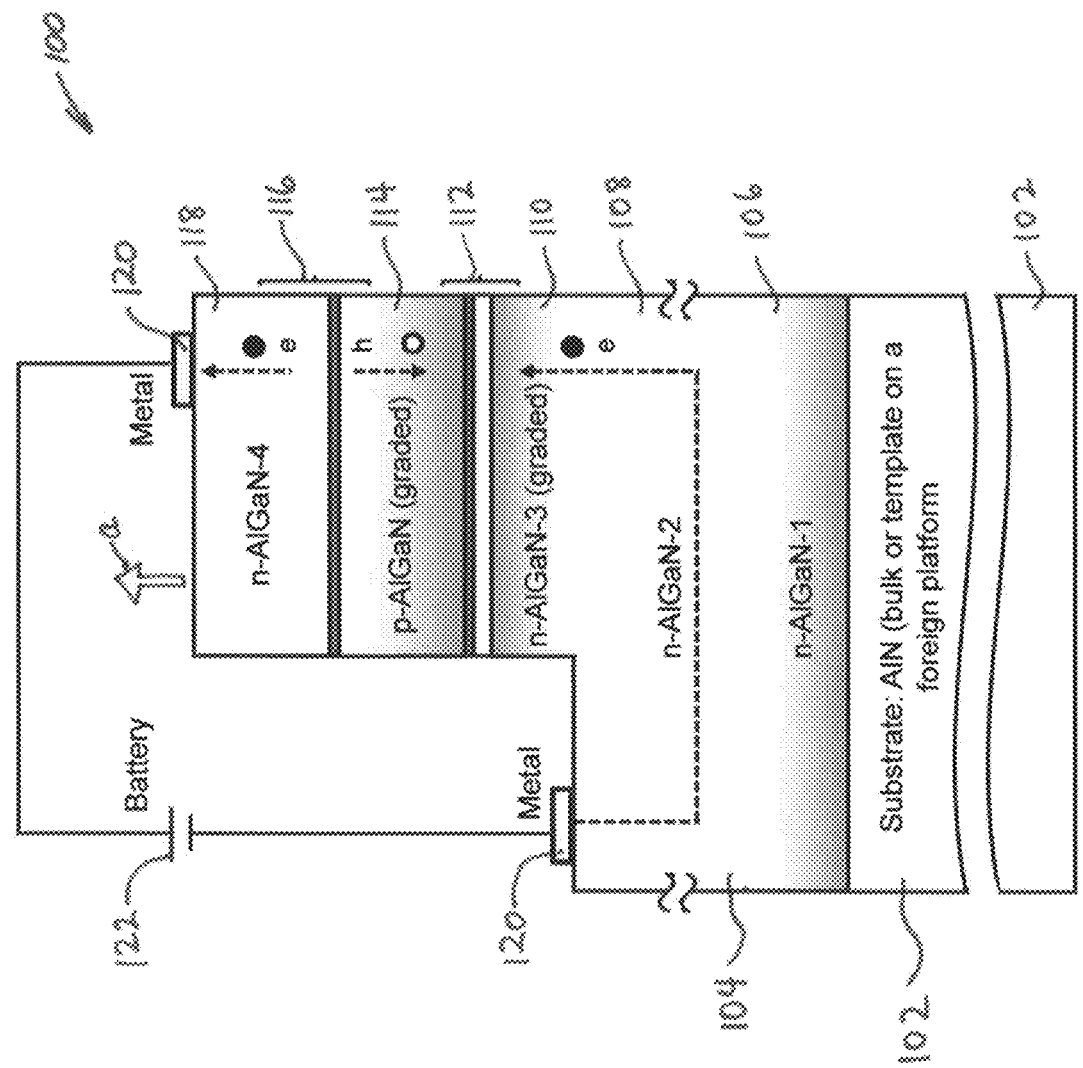
FIG. 1 is a schematic diagram of a DUV-LED in accordance with the subject disclosure.

The subject technology overcomes many of the prior art problems associated with DUV LEDs. The advantages, and other features of the technology disclosed herein, will become more readily apparent to those having ordinary skill in the art from the following detailed description of certain preferred embodiments taken in conjunction with the drawings which set forth representative embodiments of the present technology and wherein like reference numerals identify similar structural elements. Directional indications such as upward, downward, right, left, bottom, top and the like are used with respect to the figures and not meant in a limiting manner.

In brief overview, the subject technology realizes deep UV LEDs (DUV-LEDs) with design and crystal growth methods using molecular beam epitaxy (MBE). For example, the DUV-LED consists of a n-doped injection region, a p-doped injection region with polarization field-assisted doping of ternary AlGaN (Aluminum-Gallium-Nitride) wide bandgap material and a light emitting active region consisting of quantum hetero-structures to create enhanced wall-plug-efficiency for DUV LEDs by reducing carrier injection losses.

Referring now to the FIG. 1, there is shown schematically a polarization field assisted DUV-LED 100 in accordance with the subject technology. The DUV-LED 100 is a layered structure having a bottom substrate 102. The bottom substrate 102 can be single crystal Aluminum-Nitride (AlN) or a AlN template on a foreign substrate. A n-contact/injection layer 104 is formed directly on top of the bottom substrate 102. The n-contact/injection layer 104 includes three distinct AlGaN regions 106, 108, 110.

The first region 106 is preferably a n-AlGaN region fabricated of a compositionally graded buffer region doped with n-type chemical impurity to accommodate strain relaxation. The thickness of the first region 106 is preferably 100-500 nanometer (nm). For a metal polar AlGaN surface, the Aluminum content is linearly graded down from a start value of 100% to an end value of 70% near the light emitting active region for a 260 nm LED. The terminal composition of the Aluminum is decided based on the emission wavelength of the DUV-LED to ensure transparency.

The second region 108 is preferably a n-AlGaN region fabricated of a constant composition heavily impurity doped thick AlGaN lateral access region. Preferably, the impurity doping is a Silicon concentration of approximately $5\times10^{18}$ $cm^{-3}$. The thickness of the second region 108 is preferably greater than 1 micron. The second region 108 is a lateral access region that ensures the lateral electronic charge carriers access the third region 110, which is a light emitting active region. The heavy impurity doping of the second region 108 provides a low sheet resistance and higher conductivity to minimize resistive losses and heat generation.

The third region 110 is a graded vertical injection layer. The third region 110 is preferably a compositionally graded polarization doped AlGaN layer with n-type impurity. For a metal polar AlGaN surface, the Aluminum content is linearly graded up to 100% near the light emitting active region 112. The thickness of the third region 110 is preferably between about 100-200 nm. The third region 110 provides low vertical resistance to minimize the heat loss due to vertical resistance.

Preferably, the emitting active region 112 includes ultra-thin GaN/AlN quantum structures for high internal quantum efficiency due to better electron-hole overlap compared to conventional thick AlGaN quantum wells as well as high light extraction efficiency due to TE dominated surface emission from GaN compared to TM dominated edge emission from the conventional AlGaN. Such ultra-thin quantum heterostructures are described below with respect to FIGS. 4-7.

Still referring to FIG. 1, the DUV-LED 100 includes contact region 116. The contact region 116 includes a graded p-type vertical injection layer 114 above the light-emitting active region 112. To form the graded p-type vertical injection layer 114, MBE p-AlGaN layers are grown at a temperature of 650° C. or less to account for p-dopant (i.e., Magnesium) out-diffusion. By using the compositionally graded p-AlGaN for the graded p-type vertical injection layer 114, the MBE crystal growth temperature is increased compared to conventional constant Al-containing p-AlGaN without compromising the conductivity. The elevated growth temperature enhances the crystal quality and, in turn, improves the vertical carrier transport property.

The contact region 116 also includes a vertical tunnel injection layer 118 on top of the graded p-type vertical injection layer 114. Accordingly, the growth temperature for one or more layers of the contact region 116 can be increased, for example to 730° C. The elevated growth temperature enhances the crystal quality and thus the carrier transport property. The growth temperature can be the same temperature used for growing AlGaN layers such as the first layer 104. The DUV-LED 100 includes two metal contacts 120 attached to the first layer 104 and contact region 116, respectively, with a battery 122 connected between the metal contacts 120.

It can be seen that the DUV-LED 100 has built-in polarization charge of polar III-N crystals to circumvent the fundamental material related doping challenges that cause limited EQE. The compositionally graded AlGaN contact layers are further doped with chemical impurities for carrier injection from the p and n regions to enhance doping efficiency and thus improve the injection efficiency. Such field ionization makes operation of the DUV-LED 100 temperature independent as well. According, the DUV-LED 100 can function well at cryogenic temperatures.

In operation, battery 122 supplies voltage between metal contact 120 on top of layer 118 (positive terminal) and metal contact 120 on top of layer 108 (negative terminal). Under such conditions, the tunneling junction 116 will be under reverse bias and LED comprised of p-layer 116, active area 116, and n-layer 108 and region 110 under forward bias. The reverse bias allows injection of holes from layer 118 into p-AlGaN 114 and electrons into layers 108 and region 110. Due to low resistivity of the layers 108, 110, 114, the electrons and holes drift to active area 112. In the active area 112, electrons and holes localize in GaN quantum well (dots, discs) and either radiatively or non-radiatively recombine. Preferably, all recombination proceeds radiatively and photons are generated. Upon the event of photon generation, photons can exit the device 100 in all directions. For light generated in ultra-thin GaN layers, light propagation in a vertical direction (toward layers 118 or 106) is preferable, as it is indicated by arrow a.

Figure 2:
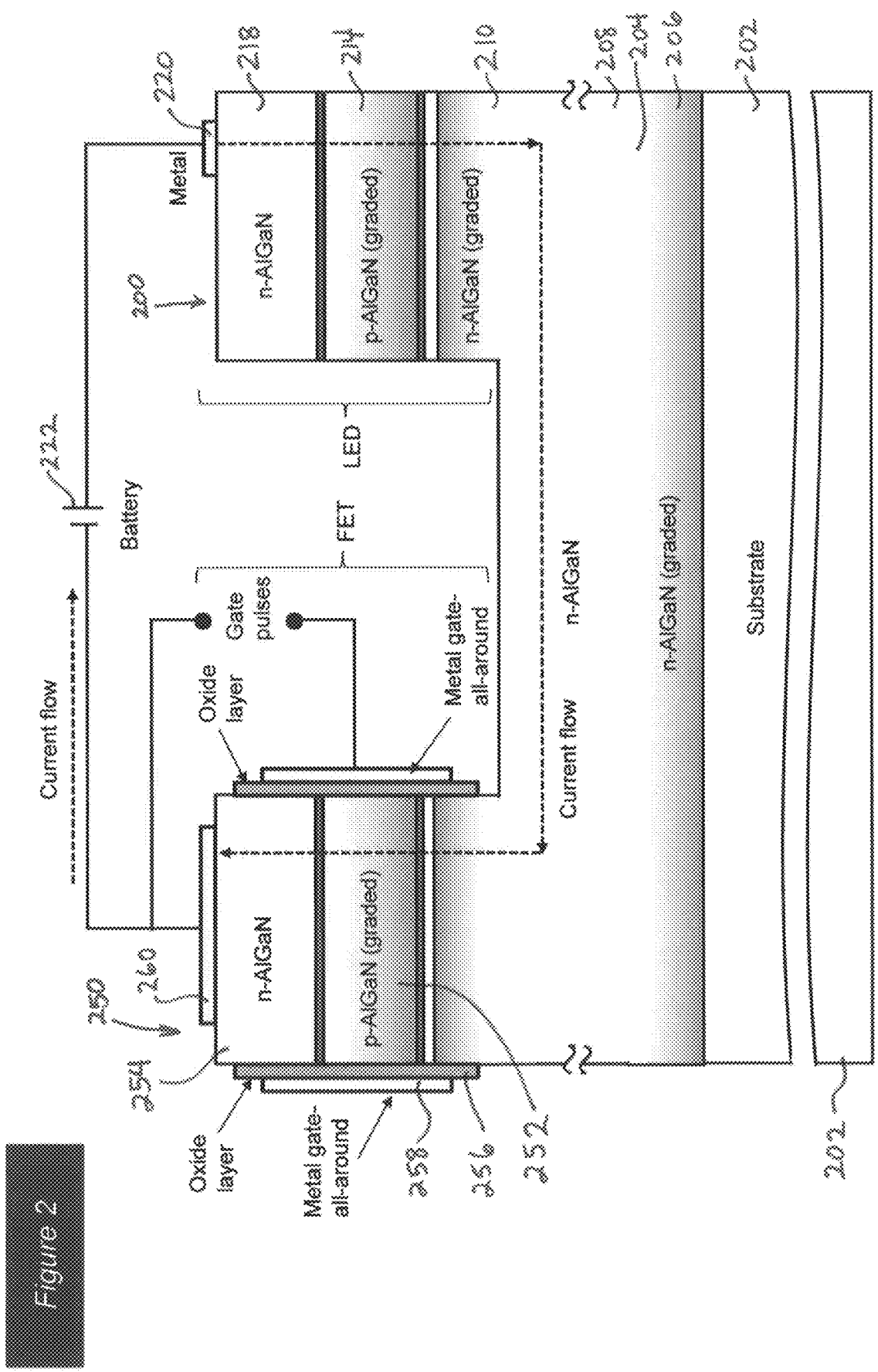
FIGS. 2 and 3 are schematic diagrams of DUV-LEDs with an integrated FET switch connected in series in accordance with the subject disclosure.

Referring now to FIG. 2, there is shown a schematic diagram of a DUV-LED assembly with an integrated FET switch 250 connected in series with a DUV-LED 200 in accordance with the subject disclosure. Similar elements to those described in connection with the DUV-LED 100 described above are indicated with the like reference numbers in the 200 series. Many elements are essentially the same as those of the foregoing embodiments and, thus, are not further described herein. Due to low electrical efficiency for DUV-LEDs, typically less than 10%, heat management is a challenge. The monolithic FET switch 250 is integrated in series to the DUV-LED 200 to run in a pulsed-mode. The pulsed operation allows for proper thermal management of the DUV-LED 200, which leads to enhanced lifetime and operation hours for the DUV-LED 200.

The FET switch 250 includes a graded p-AlGaN layer 252 similarly formed to layer 214. The graded p-AlGaN layer 252 is also formed on the region 210. A n-AlGaN layer 254 is formed on the graded p-AlGaN layer 252 in a similar manner to layer 218. To form the FET switch 250, an oxide layer 256 then a metal gate-all-around 258 are formed on the layers 210, 252, 254. A metal contact 260 is also formed on the n-AlGaN layer 254 for connection to the battery 222. Gate pulses are injected into the metal gate-all-around 258 to accomplish the pulsed operation. This is one way to incorporate the FET switch with the LED but other ways are also possible to achieved the pulsed operation.

Figure 3:
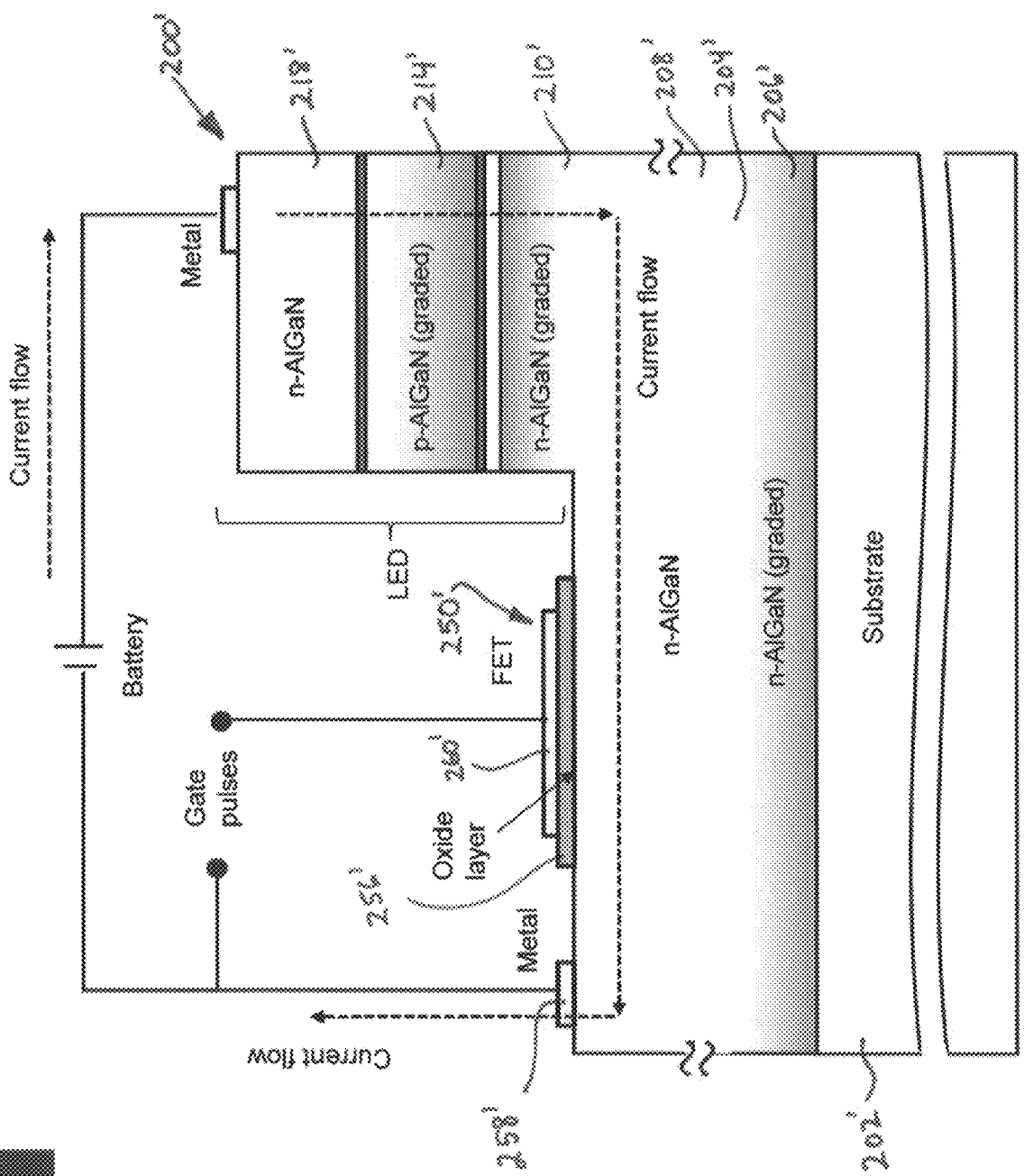

In operation, vertical metal oxide semiconductor field effect transistor (VMOSFET) 250 comprised of items 252, 254, 256, 258, 260 is connected to LED structure (items 210, 214, 218, 220) by an n-type channel (e.g., layers 204, 206, and 208). The VMOSFET 250 operates in enhancement mode (E-mode). Under positive gate-source voltage Vgs, a conductive channel for electrons is formed under the gate 258 and resistivity between n-AlGaN layers 254 and layers 204, 206, 208, 210 becomes small. It is equivalent to shortening layer 210 to negative terminal battery 222 and the LED is in the ON state. Under negative voltage on the gate 258, the channel under the gate is depleted (electrons pushed away by negative potential on the gate) and channel resistivity is high. Since the VMOSFET 250 is in series with the LED structure, only small current can flow through the LED and the LED is in the OFF state. By switching gate voltage between positive and negative potentials, the LED switches between the ON and OFF states. By varying duration of the ON state, the amount of heat generated by LED can be controlled. FIG. 3 is also a schematic diagram of a DUV-LED assembly with an integrated FET switch 250' connected in series with a DUV-LED 200' in accordance with the subject disclosure. The elements are similar to those described in connection with FIG. 2 above and indicated with the like reference numbers. Many elements are essentially the same as those of the foregoing embodiments and, thus, are not further described herein.

Figure 4:
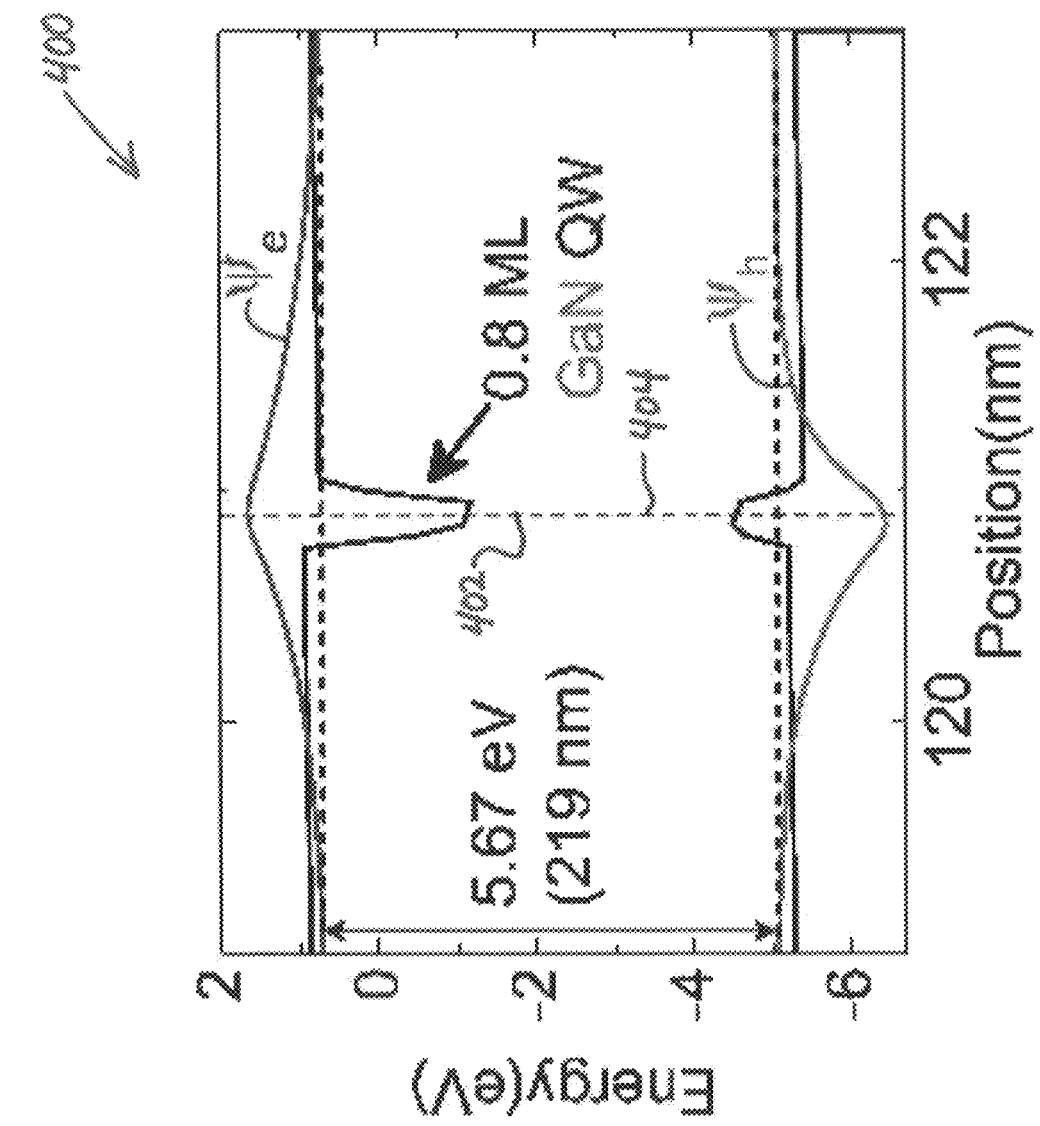
FIG. 4 is a graph of electron and hole wavefunctions for a DUV-LED with ultra-thin quantum structures in accordance with the subject technology.

Referring now to FIG. 4, a graph 400 of wavefunction for a DUV-LED with ultra-thin quantum structures in the active emitting region in accordance with the subject technology is shown. The DUV-LED has light emitters with high wavefunction overlap between the electron wave function 402 and the hole wave function 404. As a result, the DUV-LED has enhanced IQE. Further, the DUV-LED includes binary GaN/AlN quantum structures instead of AlGaN/AlGaN heterostructure to generate the DUV light. Ultra-thin GaN produces TE polarized light which propagates in a direction normal to the GaN layer of the DUV-LED for enhanced extraction. As shown in FIG. 1, the light is emitted vertically as represented by arrow a, which is a preferred direction for extraction.

Figure 5:
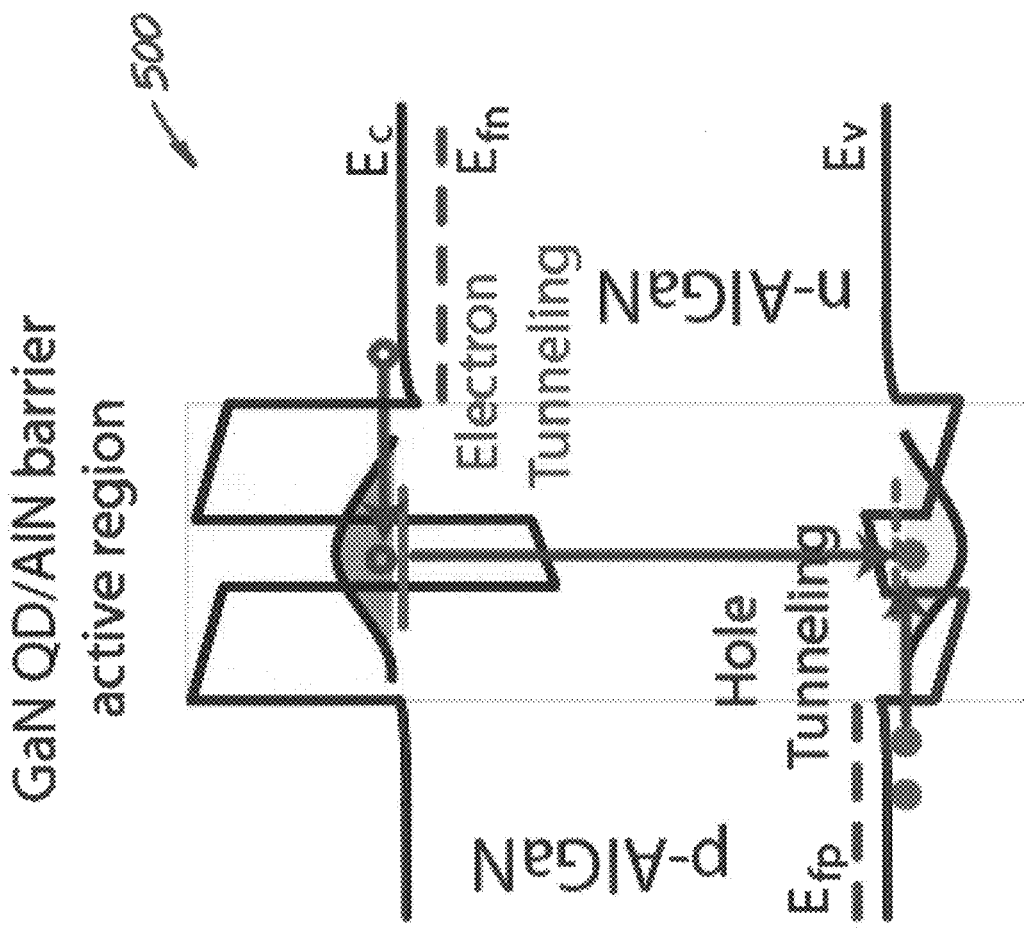
FIG. 5 is a graphic depiction of the carrier injection mechanism through the barrier into the light emitting active region using tunneling injection for ultra-thin GaN/AlN quantum heterostructures in accordance with the subject technology.

Referring now to FIG. 5, a graphic depiction 500 of the carrier injection mechanism for the light emitting active region using tunneling injection for ultra-thin GaN/AlN quantum heterostructures in accordance with the subject technology is shown. In one embodiment, the DUV-LED includes thin AlN barriers (e.g., less 2 nm) in the active region which enable tunneling injection of the charge carriers into the GaN light emitting material compared to the over-the barrier or hot-carrier injection as commonly used for prior art AlGaN—AlGaN heterostructures. Such tunneling-injection mechanism enhances the injection efficiency of the DUV-LED.

Figure 7:
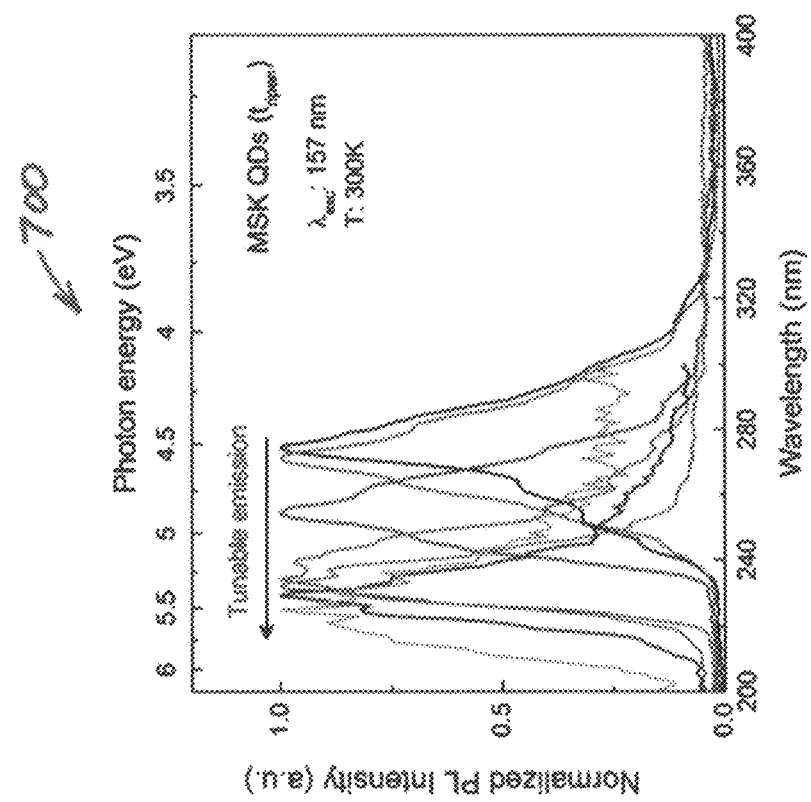
FIG. 7 is a graph of intensity versus wavelength to illustrate tunable deep-UV emission from the ultra-thin quantum heterostructure by controlling the thermal anneal duration of the GaN layer-MSK mode in accordance with the subject technology.
Figure 6:
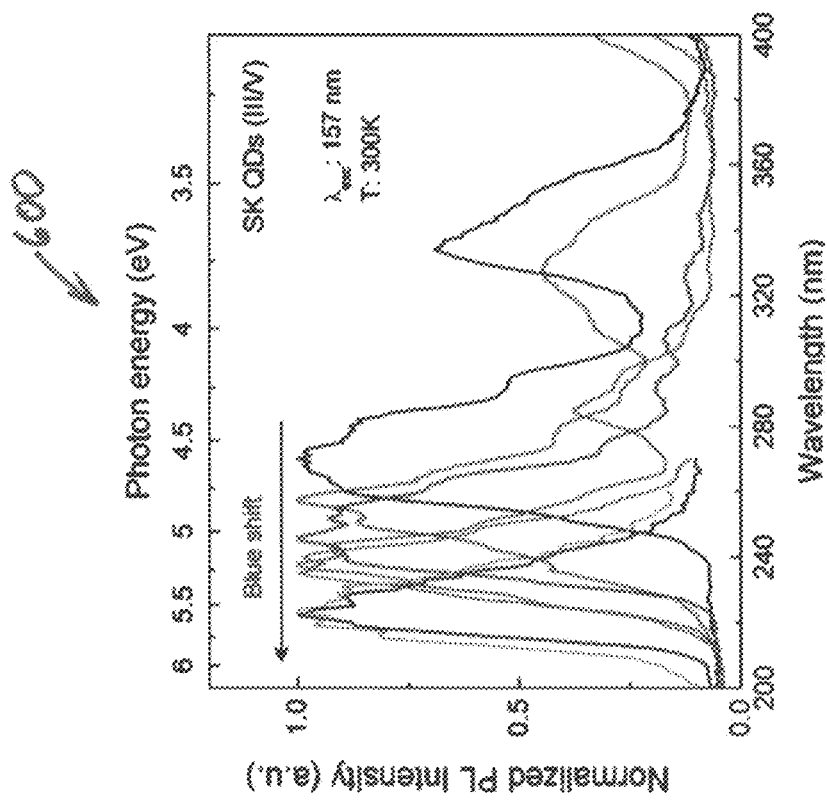
FIG. 6 is a graph of intensity versus wavelength to illustrate tunable deep-UV emission from the ultra-thin quantum heterostructure by controlling the Ga/N ratio for the GaN layer-SK mode in accordance with the subject technology.

In FIG. 6, a graph 600 of intensity versus wavelength to illustrate tunable deep-UV emission from the ultra-thin quantum heterostructure by controlling the Ga/N ratio for the GaN layer-SK (Stranski-Krastanov) mode in accordance with the subject technology is shown. Referring additionally to FIG. 7, a graph 700 of intensity versus wavelength to illustrate tunable deep-UV emission from the ultra-thin quantum heterostructure by controlling the thermal anneal duration of the GaN layer-MSK (Modified Stranski-Krastanov) mode in accordance with the subject technology is shown. Preferably, ultra-thin GaN heterostructures have a thickness ranging approximately from 0.25 nm to 0.75 nm to achieve <280 nm emission.

DUV-LEDs in accordance with the subject technology have been tunable to control the photon emission wavelength over a range of 219-280 nm using binary GaN (Gallium Nitride) and AlN (Aluminum Nitride) quantum hetero-structures. GaN and AlN are considered as III-V wide bandgap semiconductor materials, with a bulk bandgap of 3.4 eV for GaN and 6.2 eV for AlN. In one embodiment, the DUV-LED included ultra-thin 1-3 monolayers of GaN quantum heterostructures, such as quantum wells and quantum dots/discs, within AlN barriers of 2-3 nm. The effective bandgap of GaN increases up to 5.66 eV using the concept of quantum confinement as defined in quantum mechanics. The increase in the effective bandgap translates into shortening of photon emission wavelength because of the following:

$$\lambda = \frac{hc}{E}$$

photon wavelength = Plank's constant × speed of light/(Bandgap energy).

A wavelength range of 200-280 nm is considered as UV-C or deep-UV (DUV). DUV-LEDs are tunable in a range of 219-280 nm by changing the geometry of the GaN layer only while keeping the AlN barrier thickness the same. The size and/or shape of the GaN layer may be modified to make the GaN layer bigger or smaller.

In one method, the ultra-thin GaN and AlN films are deposited using MBE but other techniques like metal-organic chemical vapor deposition and the like can be used. The size of the GaN layer can be controlled by precisely controlling the epitaxial deposition time, the Ga/N ratio, and/or by the thermal annealing time and temperature of the deposited film.

In one method, wavelength tuning is accomplished by: i) deposition time of GaN; ii) controlling the Ga/N ratio (Stranski-Krastanov or SK-mode); and iii) controlling thermal anneal of the deposited GaN layer in high vacuum during the epitaxy (Modified SK or MSK mode). If only the deposition time of GaN is changed to form 1, 2 or 3 monolayers of GaN within an AlN barrier of 2-3 nm, the emission wavelength is tuned to 224 nm, 260 nm and 290 nm respectively.

For the SK-mode, where the emission wavelength tuning is achieved by controlling the Ga/N ratio, the wavelength tuning can be achieved from 219-280 nm depending on the film thickness and Ga/N ratio. The shortening of wavelength is achieved due to formation of quantum dot/disc with a Ga/N ratio of smaller than one, an N-rich growth condition as known in MBE epitaxy. For example, with three monolayers of GaN, a 240 to 280 nm range of emission can be achieved by changing the Ga/N ratio from 0.6 to 0.95. With 2 monolayers of GaN, a 219 to 260 nm range of emission can be achieved by changing the Ga/N ratio from 0.6 to 0.95.

Similar wavelength tuning over a range of 222-280 nm can be achieved by thermal anneal of the deposited GaN layers in ultra-high vacuum. The high vacuum anneal also can cause GaN quantum dot/disc formation in a 2-3 nm AlN matrix. For example, three monolayers of GaN deposited by MBE technology and then annealed for 5 to 30 seconds can provide a tuning from a 280 to 250 nm range. Two monolayers of GaN deposited by MBE and then annealed for 5 to 30 seconds can provide a tuning from a 222 to 250 nm range.

Figure 9:
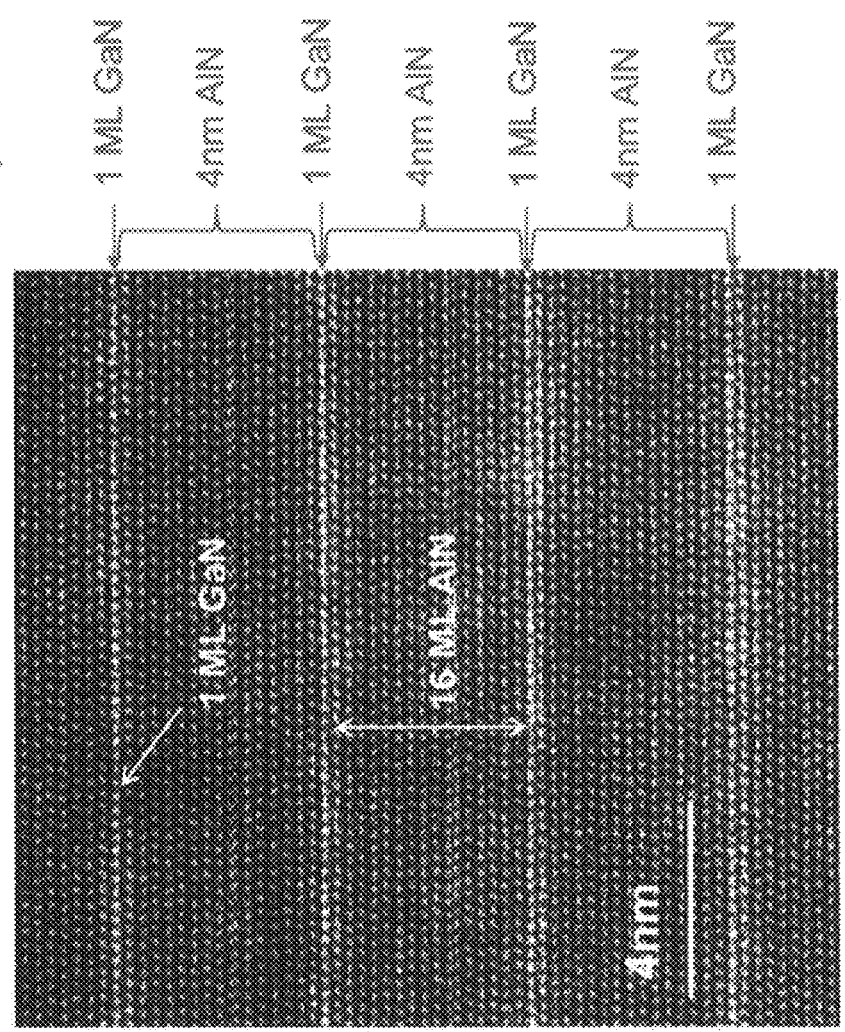
FIGS. 9-11 are depictions of ultra-thin quantum heterostructure in accordance with the subject technology.
Figure 8:
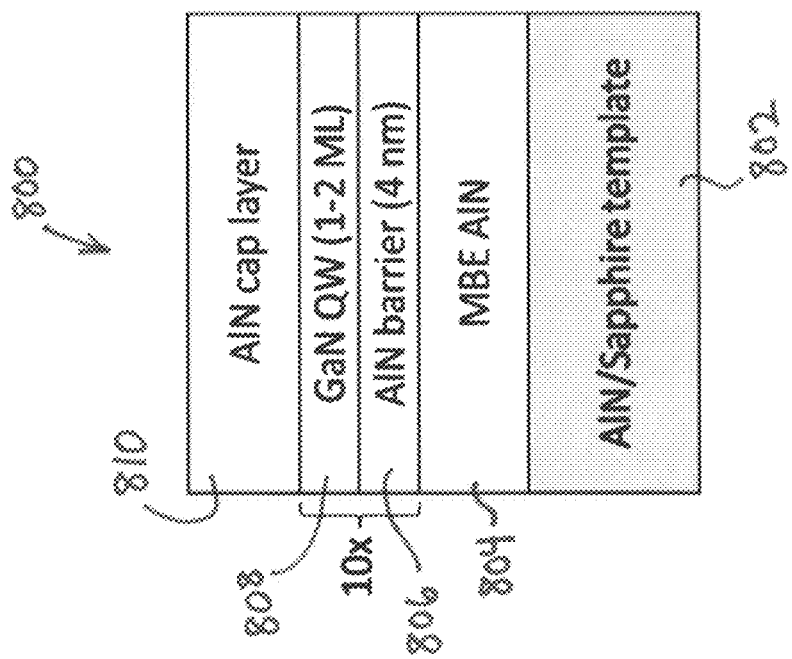
FIG. 8 is a schematic depiction of an ultra-thin quantum heterostructure in accordance with the subject technology.
Figure 10:
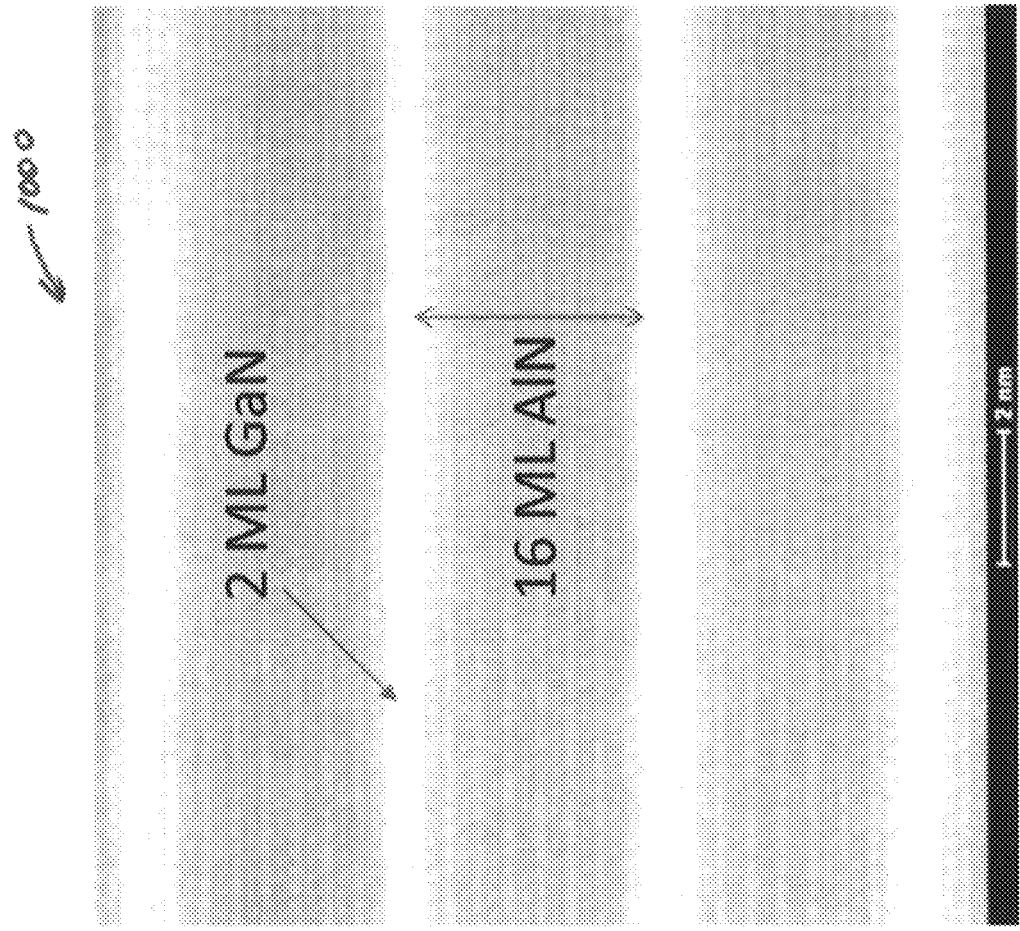
Figure 11:
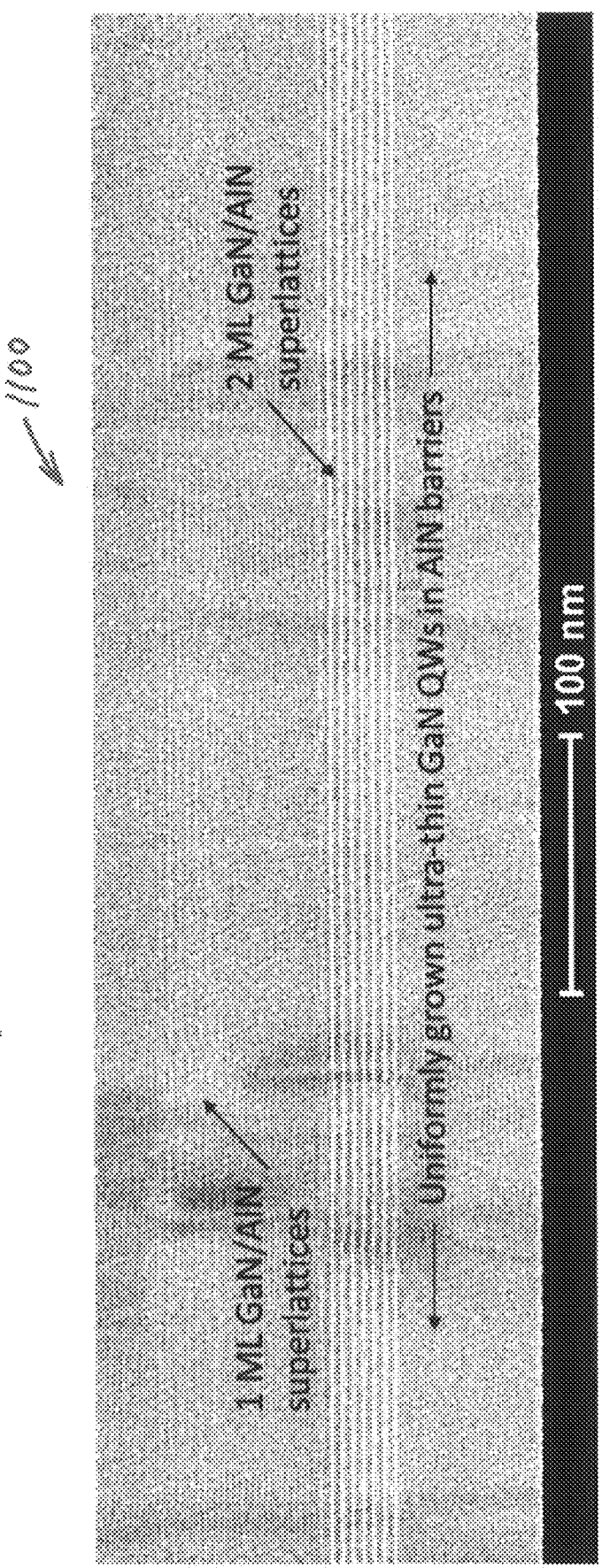

Referring now to FIG. 8, a schematic depiction 800 of an ultra-thin quantum heterostructure in accordance with the subject technology is shown. Preferably, this heterostructure is grown using MBE to have an AlN layer 804 on a 1 micron thick AlN template on sapphire as the substrate. The thickness of the AlN barrier layer 806 is about 4 nm for both one and two monolayer GaN quantum wells, which were repeated ten times. After which, an AlN cap layer 810 was formed. FIGS. 9-11 are images 900, 1000, 1100 indicating that the desired thicknesses for the GaN quantum wells and AlN barriers were achieved. In particular, FIG. 10 illustrates continuous and uniform GaN quantum wells over the entire plane of the portion shown.

While the subject technology has been described with respect to preferred embodiments, those skilled in the art will readily appreciate that various changes and/or modifications can be made to the subject technology without departing from the spirit or scope thereof as defined by the claims.

What is claimed is:

1. A light emitting diode (LED) comprising:
an emitting region with at least one ultra-thin GaN heterostructure; wherein the at least one ultra-thin GaN heterostructure comprises at least three ultra-thin monolayers of quantum wells and quantum dots/discs within AlN barriers of approximately 2-3 nm.

2. A LED as recited in claim 1, wherein the at least one ultra-thin GaN heterostructure comprises a number of layers of ultra-thin GaN heterostructures; and, wherein the number of layers of ultra-thin GaN heterostructures is from 3 to 10.

3. A LED as recited in claim 1, wherein the at least one ultra-thin GaN heterostructure has a thickness ranging approximately from 0.25 nm to 0.75 nm and is a quantum dot/disk.

4. A DUV-LED comprising:
a bottom substrate;
a n-contact/injection layer formed on the bottom substrate;
a p-contact region; and
an emitting active region between the n-contact/injection layer and the p-contact region,
the emitting active region including at least one GaN quantum heterostructure; wherein the n-contact/injection layer includes: a first region for accommodating strain relaxation; a second region for lateral access with a low sheet resistance and higher conductivity compared to the first region to minimize resistive losses and heat generation; and a third region of a graded vertical injection layer with low vertical resistance to minimize heat loss due to vertical resistance.

5. A DUV-LED as recited in claim 4, wherein the at least one GaN quantum heterostructure is selected from the group consisting of: a quantum well; a quantum dot/disk; and combinations thereof.

6. A DUV-LED as recited in claim 4, wherein the at least one GaN quantum heterostructure is sized and shaped to determine a certain emission wavelength.

7. A DUV-LED as recited in claim 6, wherein the certain emission wavelength is in a range of approximately 219-280 nm.

8. A DUV-LED as recited in claim 6, wherein a size of the at least one GaN quantum heterostructure is controlled by precisely controlling parameters selected from the group consisting of: an epitaxial deposition time; a Ga/N ratio; a thermal annealing time; a temperature during deposition; and combinations thereof.

9. A DUV-LED as recited in claim 4, wherein the at least one GaN quantum heterostructure is three ultra-thin monolayers of quantum wells and quantum dots/discs within AlN barriers of approximately 2-3 nm.

10. A DUV-LED as recited in claim 4, wherein operation of the emitting active region is pulsed.

11. A DUV-LED comprising:
a bottom substrate;
a n-contact/injection layer formed on the bottom substrate;
a p-contact region; and
an emitting active region between the n-contact/injection layer and the p-contact region,
the emitting active region including at least one GaN quantum heterostructure; wherein the at least one GaN quantum heterostructure comprises three ultra-thin monolayers of quantum wells and quantum dots/discs within MN barriers of approximately 2-3 nm.

12. A DUV-LED as recited in claim 11, wherein operation of the emitting active region is pulsed.

13. A DUV-LED as recited in claim 11, wherein a size of the at least one GaN quantum heterostructure is controlled by precisely controlling parameters selected from the group consisting of: an epitaxial deposition time; a Ga/N ratio; a thermal annealing time; a temperature during deposition; and combinations thereof.

14. A DUV-LED as recited in claim 11, wherein the at least one GaN quantum heterostructure is selected from the group consisting of: a quantum well; a quantum dot/disk; and combinations thereof.

* * * * *